United States Patent
Penzes

(10) Patent No.: US 8,957,716 B2
(45) Date of Patent: Feb. 17, 2015

(54) MULTIPLE THRESHOLD VOLTAGE STANDARD CELLS

(71) Applicant: Broadcom Corporation, Irvine, CA (US)

(72) Inventor: Paul Penzes, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 97 days.

(21) Appl. No.: 13/683,686

(22) Filed: Nov. 21, 2012

(65) Prior Publication Data

US 2014/0139262 A1    May 22, 2014

(51) Int. Cl.
  *H03K 3/12*    (2006.01)
  *H03K 19/00*    (2006.01)
  *G06F 17/50*    (2006.01)

(52) U.S. Cl.
  CPC ........ *H03K 19/0008* (2013.01); *G06F 17/5045* (2013.01)
  USPC ............ 327/199; 327/202; 327/200; 327/211

(58) Field of Classification Search
  CPC ... H03K 19/0016; H03K 19/20; H03K 3/012; H03K 3/356113; H03K 17/102; H03K 17/145; H03K 3/35625; H03K 3/3562; H03K 19/0008; H03K 3/0372; H03K 3/35606; H03K 3/356121; G06F 17/5045; G01R 31/3185
  USPC ................. 327/197, 199–218; 326/33, 95, 98
  See application file for complete search history.

(56) References Cited

U.S. PATENT DOCUMENTS

| | | | | |
|---|---|---|---|---|
| 5,982,211 A * | 11/1999 | Ko | ................................ | 327/202 |
| 5,999,030 A * | 12/1999 | Inoue | ............................ | 327/202 |
| 6,239,614 B1 * | 5/2001 | Morikawa | ........................ | 326/39 |
| 6,781,411 B2 * | 8/2004 | Steiss et al. | ...................... | 326/46 |
| 6,794,914 B2 * | 9/2004 | Sani et al. | ....................... | 327/202 |
| 6,836,175 B2 * | 12/2004 | Morikawa | ...................... | 327/534 |
| 7,180,348 B2 * | 2/2007 | Frederick et al. | ............. | 327/199 |
| 7,348,804 B2 * | 3/2008 | Hoberman et al. | ............. | 326/82 |
| 7,391,250 B1 * | 6/2008 | Chuang | ......................... | 327/211 |
| 7,940,081 B2 * | 5/2011 | Hoberman et al. | ............. | 326/38 |
| 8,085,076 B2 * | 12/2011 | Djaja et al. | ..................... | 327/202 |

* cited by examiner

*Primary Examiner* — Vibol Tan
(74) *Attorney, Agent, or Firm* — McDermott Will & Emery LLP

(57) ABSTRACT

An integrated circuit cell includes a set of circuit elements associated with a logic function along a logical path between an input and an output of the integrated circuit cell. The set of circuit elements includes a first subset of circuit elements having a first width size and a first threshold voltage and configured to operate within a cycle of time. The set of circuit elements also includes a second subset of circuit elements having a second width size and a second threshold voltage and configured to operate within the cycle of time. The first subset and second subset of circuit elements are configured to toggle data between the input and the output. The second threshold voltage is less than the first threshold voltage when the second width size is less than the first width size.

20 Claims, 7 Drawing Sheets

MULTIPLE THRESHOLD VOLTAGE STANDARD CELLS

BACKGROUND

With the substantial increase of digital components in the mobile market, power consumption has become a significant limiting factor in the practically achievable operating frequencies of integrated circuits. Circuit design is based on the number of computations. Each computation produces a discharge in capacitance. At each discharge, dynamic power is consumed with standard threshold voltage ($V_{TH}$) transistors.

One major factor of power consumption is dynamic power, which is the active power consumed while the chip is operating. Dynamic power is consumed only when the circuit is operating and only where actual nodes of the circuit are being toggled (e.g., charged/discharged). Another major factor of power consumption is leakage power. As long as the circuit is powered on, leakage power is consumed even if the circuit is not operating.

Some conventional solutions for reducing power consumption have proposed using transistors with a threshold voltage that is less than the standard threshold voltage. On one hand, lower $V_{TH}$ transistors increase the speed of circuits. On the other hand, their leakage is substantially larger (one order of magnitude or more) than standard transistor leakage. This increased leakage factors in substantially in the overall power consumptions of the final product. As such, these transistors need to be used such that their cumulative leakage power does not render the mobile device unusable (e.g., running too hot or draining the battery too quickly).

SUMMARY

A circuit and/or method is provided for a multi-threshold voltage standard cell library, substantially as illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

The subject technology provides for an integrated circuit having a combination of transistors with different threshold voltages to balance leakage power and dynamic power consumed in the circuit. For example, the circuit proposes having a subset of circuit elements operating with a default threshold voltage and another subset of circuit elements operating with a threshold voltage ($V_{TH}$) that is smaller than the default threshold voltage. As such, the subject disclosure proposes selecting lower $V_{TH}$ transistors for high-toggling, timing-critical elements of the circuit, thus allowing increased speed of operation with a minimal increase in leakage power.

These transistors are selected in a manner such that their cumulative power consumption does not render the mobile device inoperative (e.g., running too hot or draining the battery too quickly). For example, transistors with a high-toggle rates are selected to use lower $V_{TH}$ transistors, while transistors toggling sparingly (e.g., low-toggle rates) could use higher $V_{TH}$ transistors. In one or more implementations, a clock tree of a chip can be adjusted to benefit from using lower $V_{TH}$ transistors for the least amount of leakage power dissipation. This would be possible because the clock tree's insertion delay is reduced along with its depth size, thus resulting in fewer transistors needed for the circuit.

In some implementations of the subject disclosure, an integrated circuit cell for providing multi-threshold voltage cells is disclosed. The integrated circuit cell includes a set of circuit elements associated with a logic function along a logical path between an input and an output of the integrated circuit cell. The set of circuit elements includes a first subset of circuit elements having a first width size and a first threshold voltage and configured to operate within a cycle of time. The set of circuit elements also includes a second subset of circuit elements having a second width size and a second threshold voltage and configured to operate within the cycle of time. The first subset and second subset of circuit elements are configured to toggle data between the input and the output. The second threshold voltage is less than the first threshold voltage when the second width size is less than the first width size.

Figure 1:
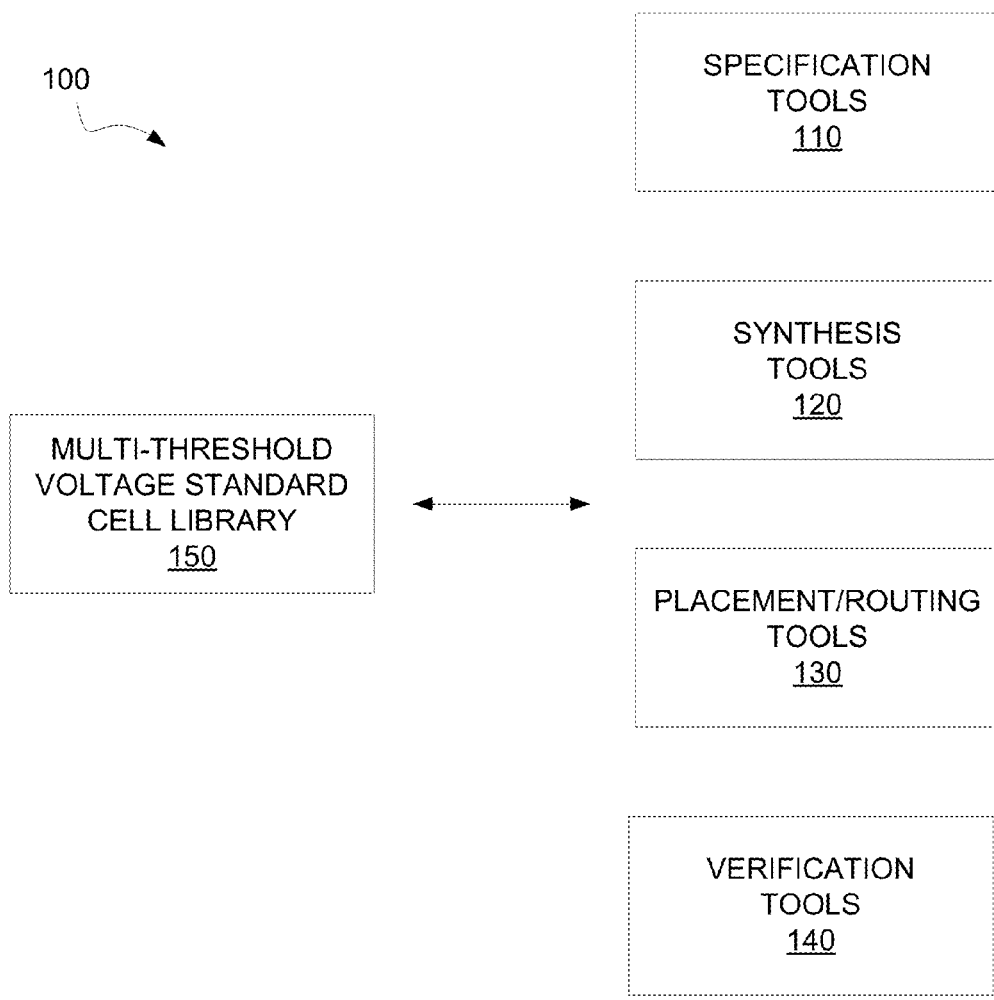
FIG. 1 illustrates a high-level environment used in the design of integrated circuits in accordance with one or more implementations.

FIG. 1 illustrates a design environment 100 used in the design of integrated circuits in accordance with one or more implementations. The design environment 100 includes specification tools 110, synthesis tools 120, placement/routing tools 130, and verification tools 140. During the design process, the functionality of the chip is specified in a specification tool 110 using a standard hardware programming language such as Verilog. The resulting circuit description is synthesized/mapped into the basic gates of a standard cell library, such as multi-threshold voltage standard cell library 150, using one or more synthesis tools 120. The resulting gate netlist is then placed and routed using placement/routing tools 130. Finally, the connectivity (LVS) and functionality of the integrated circuit are verified using a verification tool 140.

While each of these components is important for the final quality of the resulting integrated circuit, the quality of implementation achievable by most of these components is design dependent. For example, a good Verilog code specifying circuit A, does not make an independent circuit B any better. However, an adequate standard cell library makes all designs better. The quality of the standard cell library influences all designs and as such has a far reaching influence on the quality of the resulting integrated circuit chip.

With the advent of technology scaling, higher and higher levels of integration became possible due to the shrinking device sizes. At the same time, the technology scaling was providing not only an area scaling but also a delay scaling. According to Moore's "Law", chips were doubling their speed every 18 months. While this "law" has been applicable for more than 20 years, process scaling has arrived to a point that no longer delivers the expected speed increases. This is mainly due to the fact certain device parameters have reached atomic scales. One of the consequences of this speed saturation due to technology scaling is that designers need to work harder at each stage of the design flow to squeeze out the last remaining circuit performance. In other words, even small speed improvements will come at significantly higher design efforts than in the past. In particular, a standard cell library is an essential ingredient that influences all chip designs.

Figure 2:
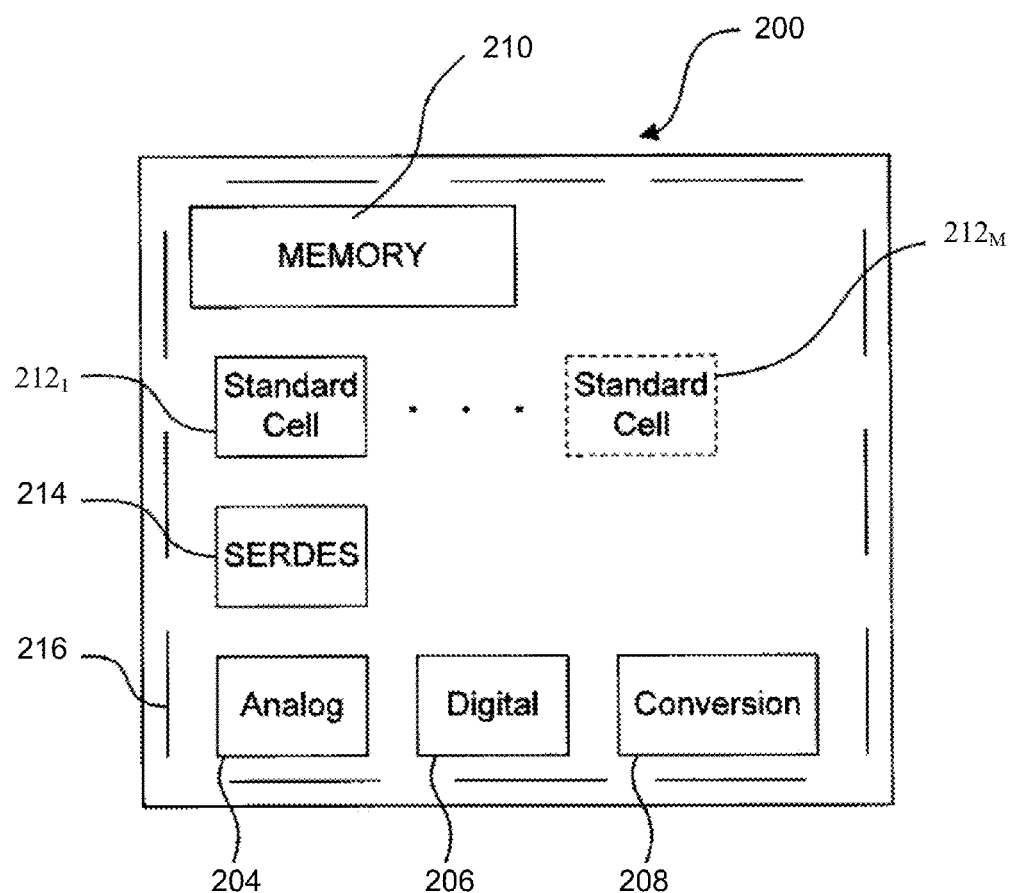
FIG. 2 illustrates a block diagram of an integrated circuit in accordance with one or more implementations.

FIG. 2 illustrates a block diagram of an integrated circuit 200 in accordance with one or more implementations. The integrated circuit 200 includes an analog portion 204, a digital portion 206, a conversion portion 208 (e.g., analog-to-digital and/or digital-to-analog conversions), a memory 210, and standard cells $212_1$-$212_M$. Optionally, the integrated circuit 200 includes a SERDES portion 214, which is a serial-deserializer device that converts input serial data to deserialized parallel data for use by the other portions of integrated circuit 200. According to some implementations, the standard cells $212_1$-$212_M$ make up a majority of the digital portion 206. In addition, the standard cells $212_1$-$212_M$ can be found as internal components of the blocks 204-210 and 214.

According to some implementations, elements 202-214 can be proprietary or manufacturer specific, with the normal exception of the standard cells $212_1$-$212_M$. The standard cells $212_1$-$212_M$ can vary in size based on a size and/or number of devices thereon, e.g., a size of logic devices (sometimes referred to as gates, and used interchangeably below) thereon or a number of logic devices thereon, to provide an optimal combination of size, signal propagation speed, or leakage. Each of the standard cells $212_1$-$212_M$ is designed to perform a specific function or set of functions or processes on a propagating signal. These functions are represented by combination of transistors forming various logic gates, as discussed in more detail below.

A standard cell library may include hundreds of the standard cells $212_1$-$212_M$ that are selectively combined to design a larger circuit. Each of the standard cells $212_1$-$212_M$ in the library is associated with a specific logic function. Each logic function may be implemented in one or more predefined cells. For example, a logic function may have multiple layouts, each having different characteristics. Each of the standard cells $212_1$-$212_M$ in a standard cell library can be laid out relative to a grid defined by horizontal and vertical tracks. The number of horizontal tracks defines the height of the cell and the number of vertical tracks defines the width of the cell. The standard cells $212_1$-$212_M$ may have the same height (or integer multiple of that height). A standard cell library is generally classified by its track height. For example, a 10-track library is composed of cells having heights of 10 tracks (or an integer multiple thereof). The widths of cells in a library may also vary. Because the heights of cells are consistent, cells of the standard cell library may be readily combined to create larger circuits.

The type and number of multi-threshold voltage cells added to the multi-threshold voltage standard cell library 150 (FIG. 1) is dependent upon the efficiency required for the synthesis tool or application. Adding too many cells to a standard cell library may significantly reduce the efficiency of the synthesis tool and the quality of the resulting integrated circuit. This is because the synthesis tool may have difficulty handling a large number of choices. Accordingly, multi-threshold voltage cells may only be provided for the most used logic functions. Commonly used functions include, but are not limited to, AND gates, NAND gates, inverters, OR gates, NOR gates, and flip flops. As design tools become more sophisticated, the multi-threshold voltage standard cell library 150 can be further extended to include multi-threshold voltage cells for a majority or all supported logic functions.

Figure 3:
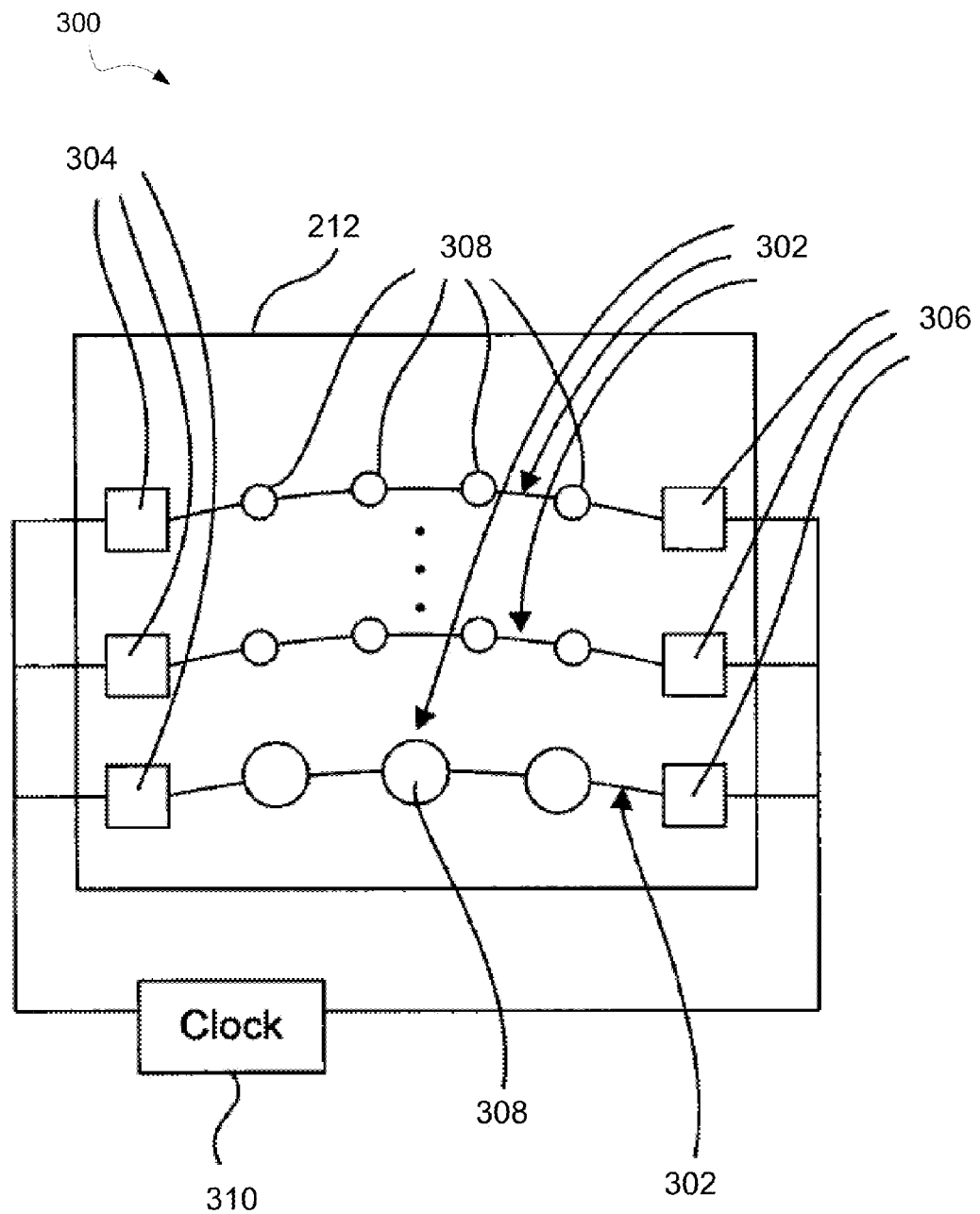
FIG. 3 illustrates a conceptual diagram of a standard cell of the integrated circuit in accordance with one or more implementations.

FIG. 3 illustrates a conceptual diagram of a standard cell 300 of the integrated circuit 200 illustrated in FIG. 2 in accordance with one or more implementations. At least one of the standard cells $212_1$-$212_M$ include one or more paths 302. Each end of a path 302 includes a corresponding first (e.g., starting) register 304 and second (e.g., ending) register 306. Each path 302 also includes logic devices 308 between the first and second registers 304 and 306. According to some implementations, the logic devices 308 are transistor-based logic devices that implement desired functions, e.g., NAND/NOR gates, inverters, or flip-flops. The logic devices 308 are used to perform one or more processes (e.g., implement one or more functions) on a propagating signal along each of the paths 302 as the signal propagates from being stored in the first register 304 to being stored in the second register 306.

Each of the registers 304 and 306 is coupled to a clock 310 that produces a clock signal setting a clock cycle. In operation, a signal is transmitted from the first register 304 along the path 302, at a first edge of the clock cycle, to be processed by the logic devices 308. At a second edge of the clock signal, the processed signal is received by the second register 306.

Each of the paths 302 may have a different propagation time based on the type of functions that are performed, the number of transistors or other similar components employed, or other characteristics of each logic device 308 along the path 302. One of the paths 302 has a propagation time that is less than the propagation time of the other paths 302 between the first and second registers 304 and 306. The path 302 with the slowest propagation time is considered a critical path. The critical path can be the path that requires a reduction in the propagation time to ensure the propagating signal is received at the second register 306 within the clock cycle.

Figure 4:
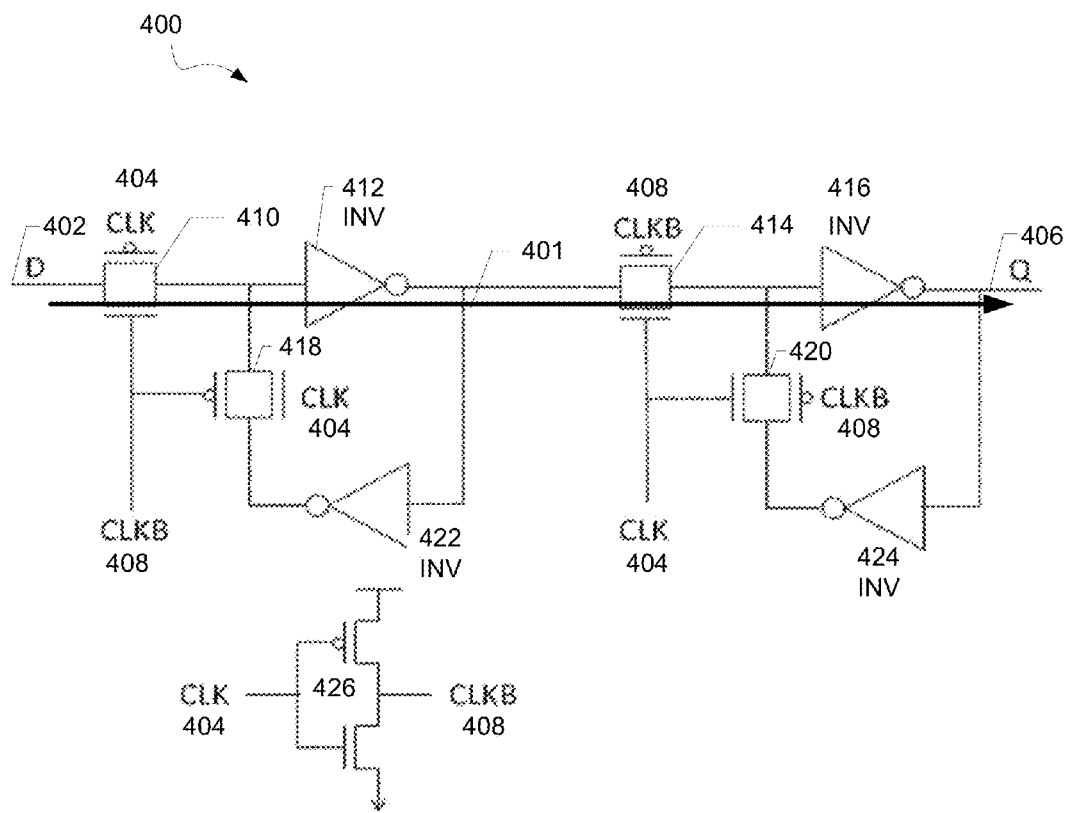
FIG. 4 illustrates a block diagram of a logical path in the standard cell in accordance with one or more implementations.

FIG. 4 illustrates a block diagram of a circuit 400 provided in the standard cell 300 illustrated in FIG. 3 in accordance with one or more implementations. The circuit 400 is configured to perform a logic function that is implemented with one or more transistors arranged in a specific topology. In one or more implementations, the logic function provides state-holding capabilities. As such, the circuit 400 has a circuit topology that represents a state-holding element, such as a master-slave flip-flop. The circuit 400 includes an input 402 ("D"), a clock input 404 ("CLK") and an output 406 ("Q") along a logical path 401. The circuit 400 also includes an inverted clock input 408 ("CLKB"), inverters 412, 416, 422 and 424, pass-gates 410, 414, 418 and 420. The elements of the circuit 400 as shown with respect to FIG. 4 can be implemented using other arrangements to provide the same or at least comparable operation of the logic function.

In one or more implementations, each of the transistors of the circuit 400 has a transistor size ratio of W/L, where W and L are each positive integers. However, the transistors can be implemented using other transistors sizes. The transistors may be configured with different types of diffusion (e.g., n-type diffusion or p-type diffusion). Accordingly, an re-channel metal-oxide semiconductor field-effect transistor (or nMOSFET) or a p-channel MOSFET can be implemented (e.g., PMOS denoted by bubbled-inputs). It is assumed that the transistors are configured with a standard threshold voltage. As a result, transistors with comparable toggle rates experience similar dynamic and leaker power consumption.

In some implementations, a clock generator 426 is electrically coupled to the circuit 400 to provide clocks for respective switching elements. The clock generator 426 has a circuit topology defining an inverter. Here, the inverted clock input 408 is derived from the clock input 404 through the inverter. In operation, the output of the clock generator 426 becomes a logical high (e.g., "1") when the clock input 404 is a logical low (e.g., "0") since the PMOS transistor powers on while the NMOS transistor remains powered off with a logical low input to drive the output high (e.g., the output is pulled-up to VDD). Alternatively, the output of the clock generator 426 becomes a logical low when the clock input 404 is a logical high since the NMOS transistor powers on while the PMOS transistors remains powered off with a logical high input to drive the output low (e.g., the output is pulled-down to ground).

In operation, the value of input 402 is sampled on a rising edge of the clock input 404, and stored in the flip-flop. That is, the value remains in a continuous loop between inverters 422 and inverters 424 until the value changes. The input 402 is made available with a small delay at the output 406. In one or more implementations, the value of input 402 is sampled on a falling edge of the clock input 404. Alternatively, the value of input 402 may be sampled on a rising edge of the inverted clock input 408.

The delay from the input 402 to the output 406 may be the sum of the propagation delay through pass-gates 410 and 414 and inverters 412 and 416 along the logical path 401. If the data has not changed from the prior clock cycle, the input D, inverters 412 and 416, and output Q will not toggle. However, pass-gates 410 and 414 will see data toggling on their controlling gate (e.g., CLK/CLKB). Also, independent of the fact that the data toggles or not, the clock generator 426, coupled to pass-gates 410 and 414, will toggle on every clock signal to produce the clock signals CLK and CLKB as stated above. In some implementations, the pass-gates 418 and 420 and inverters 422 and 424 do not contribute to the delay of the flip-flop, but rather are implemented to store the state of the input D by replenishing the charge lost via leakage power. The circuit 400 may have a circuit topology that represents a scan-flop. That is, the input D is preceded by a multiplexer element (not shown) that selects between data or test-data controlled by a test-enable input (not shown).

Figure 5:
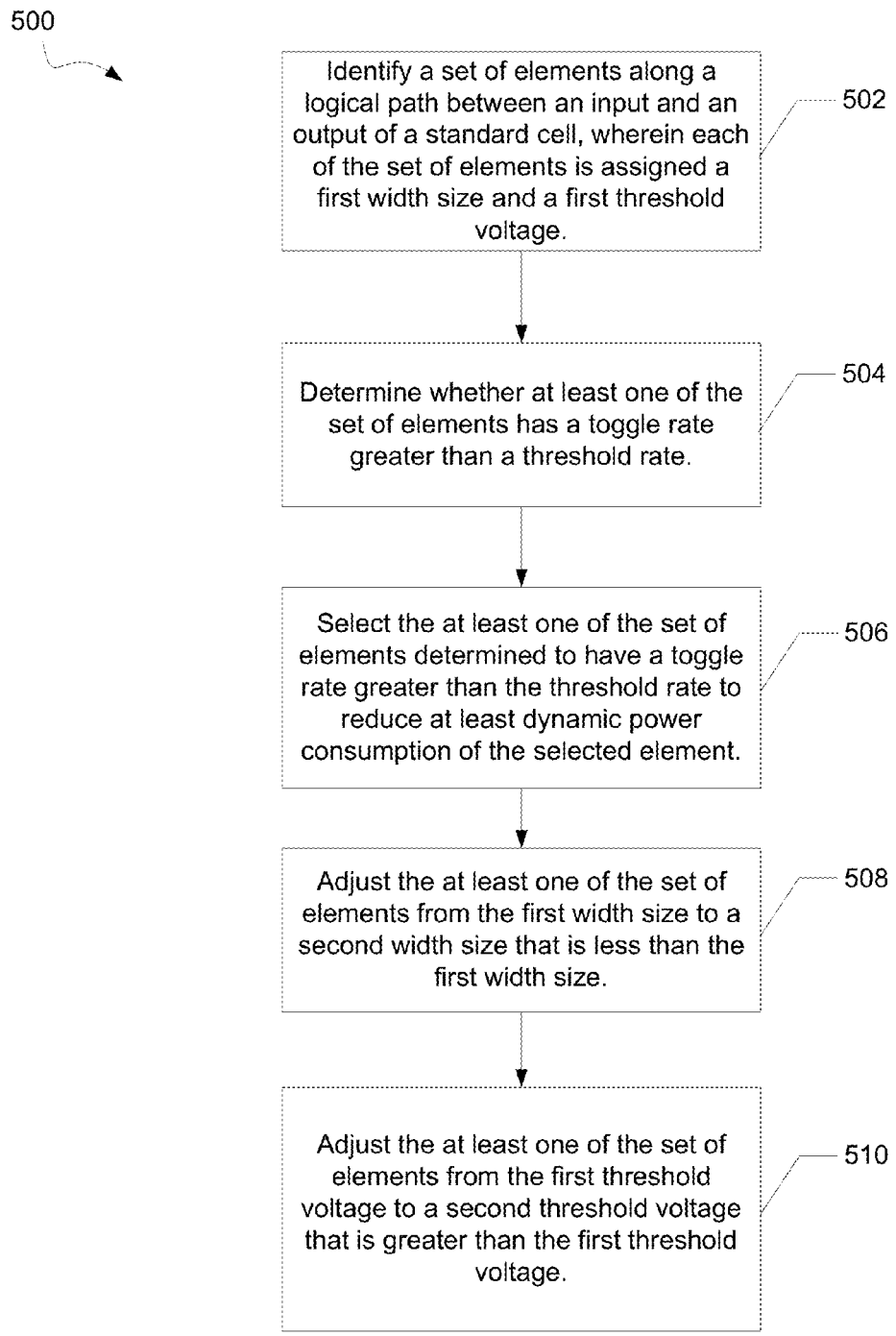
FIG. 5 illustrates a flowchart of a method for generating a standard cell using multiple threshold voltage devices in accordance with one or more implementations.

FIG. 5 illustrates a flowchart of a method 500 for generating a standard cell using multiple threshold voltage devices in accordance with one or more implementations. The method of creating multi-threshold voltage standard cells for designing integrated circuits may include identifying a set of elements along a logical path between an input and an output of a standard cell (502). Each of the set of elements may be assigned a first width size and a first threshold voltage. With reference to FIG. 4, the inverters 412, 416, 422 and 424, and pass-gates 410, 414, 418 and 420 are identified to have a default threshold voltage operating at a comparable speed. The above-identified elements may be configured to have a width size of W, where W is a positive integer.

The method also may include determining whether at least one of the set of elements has a toggle rate greater than a threshold rate (504). The inverters 412 and 416, and pass-gates 410 and 414 may be determined to toggle more often then the remaining elements of the circuit such that their toggle rate causes these transistors to consume more dynamic power during operation.

The method also may include selecting the at least one of the set of elements determined to have a toggle rate greater than the threshold rate to reduce at least dynamic power consumption of the selected element (506). This allows earlier termination of the computation, which then enables the selected element to power off. As such, the inverters 412 and 416, and pass-gates 410 and 414 are selected as candidates for sizing and threshold voltage adjustments.

The method also may include adjusting the at least one of the set of elements from the first width size to a second width size that is less than the first width size, thus allowing reduced toggling capacitance (508). Here, the inverters 412 and 416, and pass-gates 410 and 414 may be reduced in size by a computational factor. As a result, the propagation delay across these elements increases since the reduced sizing provides a lower drive strength, thus requiring some speed-up mechanism.

Accordingly, the method includes adjusting the at least one of the set of elements from the first threshold voltage to a second threshold voltage that is greater than the first threshold voltage in order to reduce the propagation time of the logical path 401 in response to the adjustment from the first width size to the second width size (510). The inverters 412 and 416, and pass-gates 410 and 414 are assigned lower $V_{TH}$ transistors to reduce the propagation delays across the elements, thus providing comparable or an increase in the operational speed (e.g., propagation delay is reduced) before any of the adjustments. In one or more implementations, the remaining transistors (e.g., inverters 422 and 424, and pass-gates 418 and 420) may be configured with higher $V_{TH}$ transistors to reduce the leaker power consumed by these less-toggling elements.

After the method 500 is completed, the multi-threshold voltage cells are available to the synthesis tool 120 (FIG. 1) and circuits can be synthesized using them. When the multi-threshold voltage cells are added to a 20 nm standard cell library, for example, the dynamic power of the circuit may be substantially reduced (e.g., 20-30%) without any speed and/or area penalty. As a side effect, the leakage power of the circuit may increase slightly (e.g., 10-15%).

In some implementations, the method includes determining whether at least one of the set of elements has a toggle rate less than the threshold rate. The method then may include selecting the at least one of the set of elements determined to have a toggle rate smaller than the threshold rate. The method then further may include adjusting the at least one of the set of elements from the first threshold voltage to a third threshold voltage that is greater than the first threshold voltage to reduce leakage power consumption. The method also may include selecting the third threshold voltage from a characteristic curve that causes leakage power to reduce greater than or equal to a threshold amount. Alternatively, the method may include selecting the second threshold voltage from a characteristic curve that causes leakage power to increase smaller than or equal to a threshold amount.

In one or more implementations, the adjusting of the at least one of the set of elements from the first width size to the second width size causes the at least one of the set of elements to dissipate a reduced amount of dynamic power. Additionally, the adjusting of the at least one of the set of elements from the first threshold voltage to the second threshold voltage causes the at least one of the set of elements to dissipate an increased amount of leakage power.

The method also may include comparing a decreased amount of dynamic power and an increased amount of leakage power when the at least one of the set of elements are adjusted with respect to width sizing and threshold voltage. The method may then include determining whether to seize adjustments to the width sizing and the threshold voltage when the increased amount of leakage power reaches a threshold amount. The method also may include evaluating the logical path for timing to determine whether the second threshold voltage or the second width size requires further adjustment. Alternatively, the method may include evaluating the logical path for power consumption to determine whether the second threshold voltage or the second width size requires further adjustment.

Figure 6:
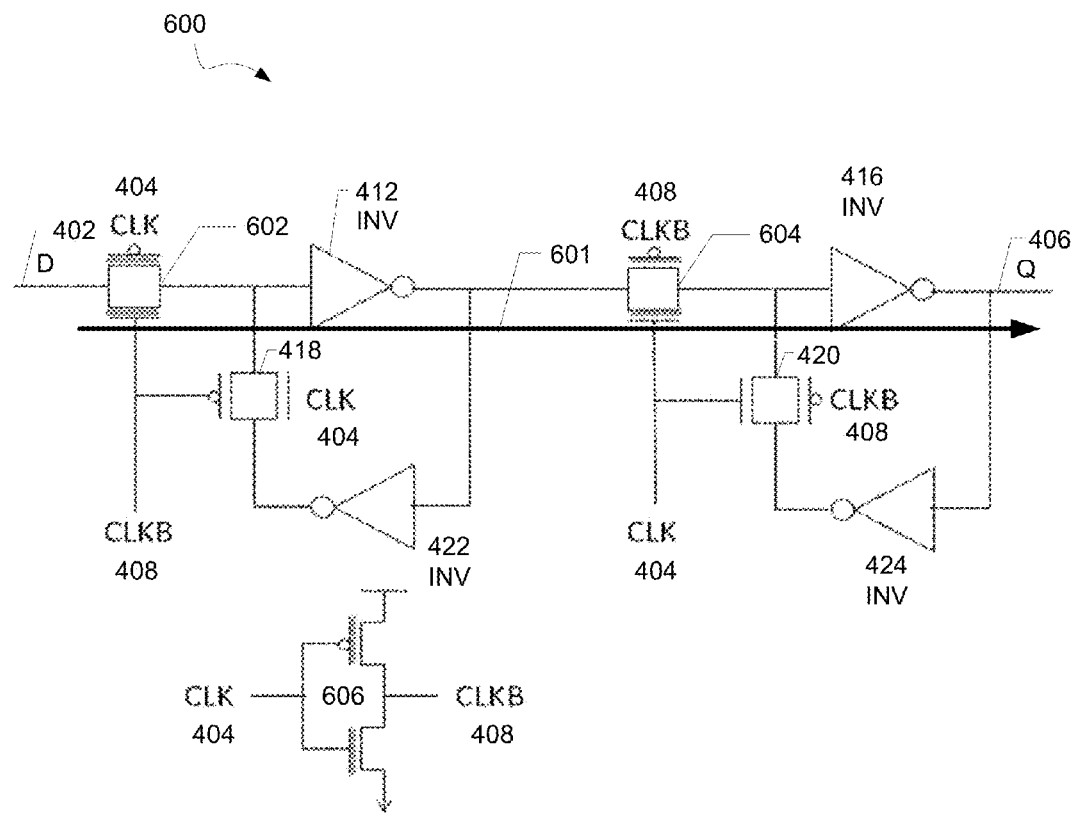
FIG. 6 illustrates a block diagram of a logical path in the standard cell using multiple threshold voltage devices in accordance with one or more implementations.

FIG. 6 illustrates a block diagram of a logical path in a standard cell 600 using multiple threshold voltage devices in accordance with one or more implementations. The standard cell 600 includes the same number of elements to those depicted in FIG. 4. The standard cell 600 is composed of circuit elements associated with a logic function along a logical path 601 between the input 402 (FIG. 4) and the output 406 (FIG. 4). Here, the circuit topology is again defined as a state-holding element (e.g., master-slave flip-flop) with circuit elements associated with one or more logic functions (e.g., inverter, flip-flop).

The set of circuit elements may include a first subset of circuit elements assigned a first width size and a first threshold voltage. For example, pass-gates 418 and 420 and inverters 422 and 424 are configured with a transistor width size of W/L and a standard (or default) threshold voltage. The set of circuit element also may include a second subset of circuit elements assigned a second width size and a second threshold voltage. For example, pass-gates 602 and 604 and clock generator 606 are configured with a different transistor width size and a different threshold voltage than the first subset of circuit elements. The first subset and second subset of circuit elements are configured to toggle data between the input and the output. As stated above with respect to FIG. 4, the value of the input 402 is sampled on a rising edge of the clock input 404, and stored in the flip-flop. The input D is then made available with a small delay at the output 406.

The second width size of the second subset of circuit elements is smaller than the first width size if the second subset of circuit elements has a toggle rate greater than a threshold rate. The second threshold voltage is configured to be smaller than the first threshold voltage to cause the second subset of circuit elements to operate within a cycle of time at least comparable to the first subset of circuit elements. The second subset of circuit elements are configured with a lower threshold voltage to compensate for the reduced width size.

Here, the transistors corresponding to the second subset of circuit elements are identified to toggle every clock cycle. As such, their transistor width sizes are reduced (e.g., by ½) compared to the corresponding transistors in FIG. 4, thus resulting in reduced power consumption (e.g., defined by $CV^2$, where C is a capacitance and V is a voltage) across the transistors (e.g., the logical path from input D to output Q). Accordingly, pass-gates 602 and 604 have their transistor width sizes reduced to W/2. The adjusted transistors of the standard cell 600 as shown with respect to FIG. 6 can be adjusted by other sizing factors (e.g., ¼, ⅛ or ⅘). Similarly, the inverter implemented as the clock generator 606 is reduced by some factor (e.g., ½).

The remaining transistors (e.g., inverters 422 and 424, and pass-gates 418 and 420) remain unchanged because these transistors toggle less often. As such, a determination can be made to select which transistors of the standard cell 600 toggle more often or less often. Accordingly, the determination can be based on a comparison between the toggle rate of the transistor and a threshold rate. In some implementations, the threshold rate is predefined as a numerical value that is dependent upon the circuit's overall power consumption and/or capacitive load. Additionally, the determination can be based on the circuit's operational speed such that the transistors identified to receive adjustments are located along the circuit's critical timing path. Therefore, the critical timing path can be improved without area and/or speed penalty.

One of the effects of adjusting the transistors is that the clock path delay improves due to the reduced load. Besides the delay itself, this will provide better device matching including implementation of a clock tree constructed with transistor cells of lower threshold voltage. Although the altered devices have their leakage power increase due to the lower threshold voltage characteristics of the transistors, their relative leakage power contribution is significantly smaller than their dynamic power contribution so the increase does not significantly alter the original power consumption landscape.

In one or more implementations, the circuit 400 includes, but not limited to, a flip-flop, a scan flip-flop, set and reset flip-flops or any other derivative of the flip-flop, and circuits with different toggle rates along different paths.

A non-transitory computer-readable medium for producing the multi-threshold voltage standard cell library 150 may include processor-executable instructions that cause a processor to perform operations including identifying a set of elements along a logical path between an input and an output of a standard cell. Each of the set of elements is assigned a first width size and a first threshold voltage. The operations also may include determining whether at least one of the set of elements has a toggle rate greater than a threshold rate. The operations also may include selecting the at least one of the set of elements determined to have a toggle rate greater than the threshold rate to reduce at least dynamic power consumption by the selected element. The operations also may include adjusting the at least one of the set of elements from the first width size to a second width size that is smaller than the first width size. The operations also may include adjusting the at least one of the set of elements from the first threshold voltage to a second threshold voltage to increase an operational speed of the logical path in response to the adjustment from the first width size to the second width size.

Figure 7:
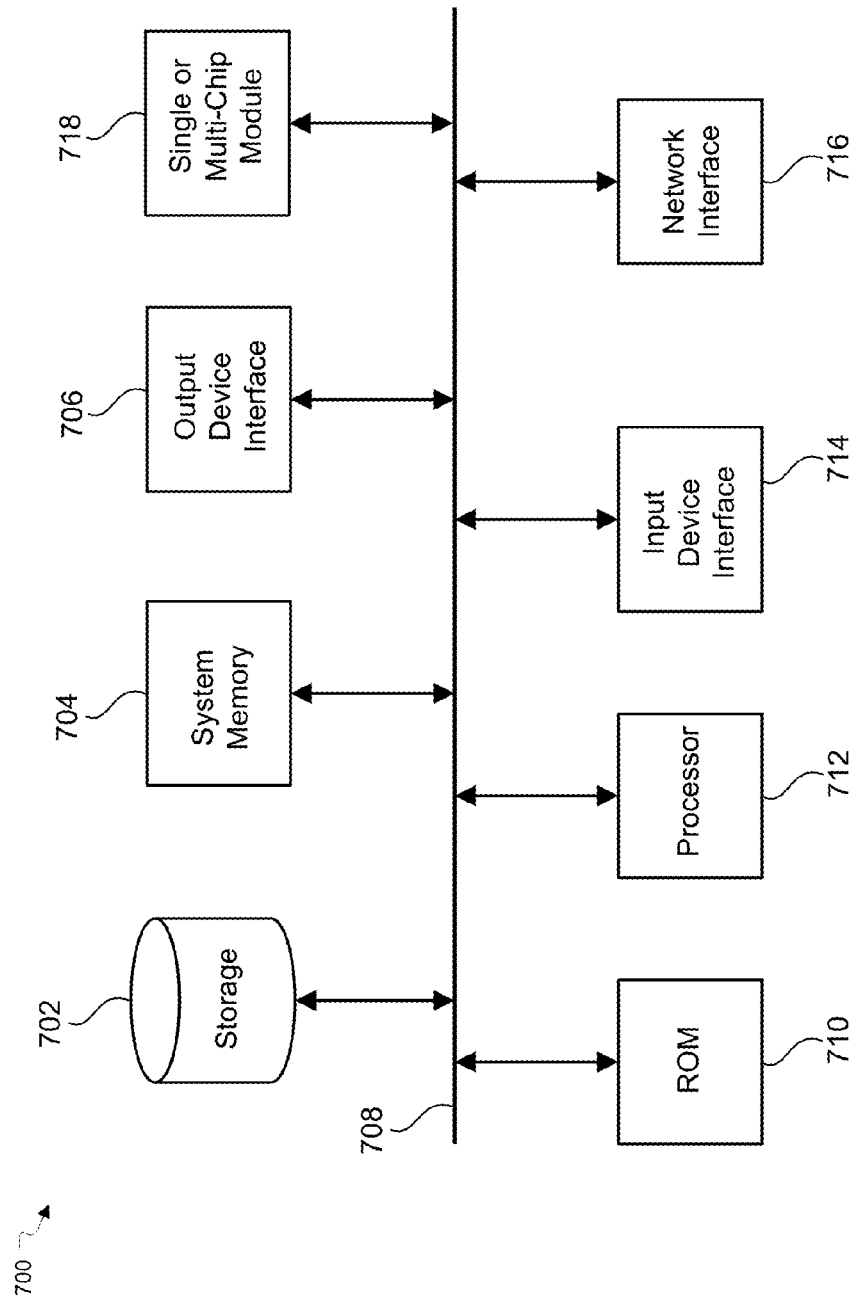
FIG. 7 conceptually illustrates a single or multi-chip module using multiple threshold voltage standard cells in an electronic system in accordance with one or more implementations.

FIG. 7 conceptually illustrates a single or multi-chip module 718, which can be an integrated circuit using multiple threshold voltage standard cells in an electronic system 700 in accordance with one or more implementations. The electronic system 700 includes a bus 708, processing unit(s) 712, a system memory 704, a read-only memory (ROM) 710, a permanent storage device 702, an input device interface 714, an output device interface 706, and a network interface 716, or subsets and variations thereof.

The bus 708 collectively represents all system, peripheral, and chipset buses that communicatively connect the numerous internal devices of electronic system 700. In one or more implementations, the bus 708 communicatively connects the processing unit(s) 712 with the ROM 710, the system memory 704, and the permanent storage device 702. From these various memory units, the processing unit(s) 712 retrieves instructions to execute and data to process in order to execute the processes of the subject disclosure. The processing unit(s) can be a single processor or a multi-core processor in different implementations.

The ROM 710 stores static data and instructions that are needed by the processing unit(s) 712 and other modules of the electronic system. The permanent storage device 702, on the other hand, is a read-and-write memory device. This device is a non-volatile memory unit that stores instructions and data even when the electronic system 700 is off. One or more implementations of the subject disclosure use a mass-storage device (such as a magnetic or optical disk and its corresponding disk drive) as the permanent storage device 702.

Other implementations use a removable storage device (such as a floppy disk, flash drive, and its corresponding disk drive) as the permanent storage device 702. Like the permanent storage device 702, the system memory 704 is a read-and-write memory device. However, unlike the storage device 702, the system memory 704 is a volatile read-and-write memory, such as random access memory. System memory 704 stores any of the instructions and data that the processing unit(s) 712 needs at runtime. In one or more implementations, the processes of the subject disclosure are stored in the system memory 704, permanent storage device 702, and/or ROM 710. From these various memory units, the processing unit(s) 712 retrieves instructions to execute and data to process in order to execute the processes of one or more implementations.

Bus 708 also connects to input and output device interfaces 714 and 706. The input device interface 714 enables a user to communicate information and select commands to the electronic system. Input devices used with the input device interface 714 include, for example, alphanumeric keyboards and pointing devices (also called "cursor control devices"). Output device interface 706 enables, for example, the display of images generated by the electronic system 700. Output devices used with the output device interface 706 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 7, the bus 708 also couples the electronic system 700 to a network (not shown) through the network interface 716. In this manner, the computer can be a part of a network of computers (such as a local area network ("LAN"), a wide area network ("WAN"), or an Intranet, or a network of networks, such as the Internet. Any or all components of the electronic system 700 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples of the disclosure. A phrase such an "implementation" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An integrated circuit cell, comprising:
a set of circuit elements associated with a logic function along a logical path between an input and an output of the integrated circuit cell, the set of circuit elements comprising:
a first subset of circuit elements having a first width size and operative at a first threshold voltage and configured to operate within a cycle of time; and
a second subset of circuit elements having a second width size and operative at a second threshold voltage and configured to operate within the cycle of time,
wherein the first subset and second subset of circuit elements are configured to toggle data between the input and the output, and
wherein the second threshold voltage is less than the first threshold voltage when the second width size is less than the first width size.

2. The integrated circuit cell of claim 1, wherein:
the second width size causes a reduction in dynamic power consumption,
the second threshold voltage compensates for the reduction in width size of the second subset of circuit elements, and
the second subset of circuit elements is configured to toggle data along a critical path of the integrated circuit cell.

3. The integrated circuit cell of claim 1, wherein:
each of the first and second subset of circuit elements is a transistor, and
the second threshold voltage is selected to reduce a propagation time of the second subset of circuit elements.

4. The integrated circuit cell of claim 1, wherein:
the first and second subset of circuit elements are arranged according to a circuit topology associated with a logic function, and
the second threshold voltage causes an increase in leakage power consumption while reducing a propagation time through the second subset of circuit elements.

5. The integrated circuit cell of claim 1, wherein:
the first subset of circuit elements is configured to toggle data at a first toggle rate,
the second subset of circuit elements is configured to toggle data at a second toggle rate greater than the first toggle rate, and
the first threshold voltage is greater than a default threshold voltage when the first toggle rate is less than a threshold rate.

6. The integrated circuit cell of claim 1, wherein:
the first subset of circuit elements is configured to toggle data at a first toggle rate,
the second subset of circuit elements is configured to toggle data at a second toggle rate greater than the first toggle rate, and the second threshold voltage is less than a default threshold voltage when the second toggle rate is greater than a threshold rate.

7. The integrated circuit cell of claim 1, wherein:
the first subset of circuit elements is configured to toggle data at a first toggle rate,
the second subset of circuit elements is configured to toggle data at a second toggle rate that is greater than the first toggle rate, and
the second threshold voltage is less than the first threshold voltage when the second toggle rate is greater than a threshold rate.

8. An integrated circuit cell, comprising:
a first set of elements operative at a first threshold voltage and configured to toggle data at a first toggle rate; and
a second set of elements operative at a second threshold voltage and configured to toggle data at a second toggle rate that is greater than the first toggle rate,
wherein the second threshold voltage is less than the first threshold voltage when the second set of elements have width sizes that are less than the first set of elements.

9. The integrated circuit cell of claim 8, wherein the first threshold voltage is greater than a default threshold voltage when the first toggle rate is less than a threshold rate.

10. The integrated circuit cell of claim 8, wherein the second threshold voltage is less than a default threshold voltage when the second toggle rate is greater than a threshold rate.

11. The integrated circuit cell of claim 8, wherein the second threshold voltage is less than the first threshold voltage when the second toggle rate is greater than a threshold rate.

12. An integrated circuit cell, comprising:
a first terminal;
a second terminal;
a circuit arrangement configured to provide a logical path between the first terminal and the second terminal, wherein the circuit arrangement comprises:
a first set of elements operative at a first threshold voltage, and
a second set of elements operative at a second threshold voltage, the second threshold voltage being lower than the first threshold voltage, wherein at least one of the second set of elements is configured to toggle data at a toggle rate different from the first set of elements.

13. The integrated circuit cell of claim 12, wherein at least one element of the second set of elements has a width size smaller than each of the first set of elements.

14. The integrated circuit cell of claim 12, wherein toggle rate of at least one element of the first set of elements is independent of toggling of data of the first terminal and independent of toggling of data of the second terminal.

15. The integrated circuit cell of claim 12, wherein the at least one element of the second set of elements is configured to toggle each clock cycle due to a signal applied to the at least one element.

16. The integrated circuit cell of claim 15, wherein the second set of elements comprises at least one transistor coupled to the first terminal, the at least one transistor being configured to receive a first terminal signal from the first terminal and a clock signal.

17. The integrated circuit cell of claim 12, wherein:
the first set of elements have width sizes different from the second set of elements, and
each element of the second set of elements is connected to at least one element of the first set of elements.

18. The integrated circuit cell of claim 12, wherein the first threshold voltage is greater than a default threshold voltage when a first toggle rate of the first set of elements is less than a threshold rate.

19. The integrated circuit cell of claim 12, wherein the second threshold voltage is less than a default threshold voltage when the toggle rate of the at least one of the second set of elements is greater than a threshold rate.

20. The integrated circuit cell of claim 12, wherein the second threshold voltage is less than the first threshold voltage when the toggle rate of the at least one of the second set of elements is greater than a threshold rate.

* * * * *